(12) United States Patent
Ahmed et al.

(10) Patent No.: US 8,906,709 B1
(45) Date of Patent: Dec. 9, 2014

(54) COMBINATORIALLY VARIABLE ETCHING OF STACKS INCLUDING TWO DISSIMILAR MATERIALS FOR ETCH PIT DENSITY INSPECTION

(71) Applicant: Intermolecular, Inc., San Jose, CA (US)

(72) Inventors: Khaled Ahmed, Anaheim, CA (US);
Frank Greer, Pasadena, CA (US);
George Mirth, Saratoga, CA (US);
Zhi-Wen Sun, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/138,797

(22) Filed: Dec. 23, 2013

Related U.S. Application Data

(60) Provisional application No. 61/842,861, filed on Jul. 3, 2013.

(51) Int. Cl.
*H01L 21/66* (2006.01)
(52) U.S. Cl.
CPC ..................................... *H01L 22/12* (2013.01)
USPC ................................... 438/16; 438/8; 438/14
(58) Field of Classification Search
USPC ............................. 438/7, 8, 9, 14, 15, 16, 17
See application file for complete search history.

(56) References Cited

U.S. PATENT DOCUMENTS 8,383,430 B2 * 2/2013 Verma et al. .................... 438/18
8,501,505 B2 * 8/2013 Verma et al. .................... 438/18
8,633,039 B2 * 1/2014 Verma et al. .................... 438/18

OTHER PUBLICATIONS

Yamaguchi et al.; Thermal annealing effects of defect reduction in GaAs on Si substrates; Nov. 1, 1990; Journal of Applied Physics; American Institute of Physics; pp. 4518-4522.

* cited by examiner

*Primary Examiner* — Kevin M Picardat

(57) ABSTRACT

Provided are methods of high productivity combinatorial (HPC) inspection of semiconductor substrates. A substrate includes two layers of dissimilar materials interfacing each other, such as a stack of a silicon bottom layer and an indium gallium arsenide top layer. The dissimilar materials have one or more of thermal, structural, and lattice mismatches. As a part of the inspection, the top layer is etched in a combinatorial manner. Specifically, the top layer is divided into multiple different site-isolated regions. One such region may be etched using different process conditions from another region. Specifically, etching temperature, etching duration and/or etchant composition may vary among the site-isolated regions. After combinatorial etching, each region is inspected to determine its etch-pit density (EPD) value. These values may be then analyzed to determine an overall EPD value for the substrate, which may involve discarding EPD values for over-etched and under-etched regions.

19 Claims, 6 Drawing Sheets

COMBINATORIALLY VARIABLE ETCHING OF STACKS INCLUDING TWO DISSIMILAR MATERIALS FOR ETCH PIT DENSITY INSPECTION

CROSS-REFERENCE TO RELATED APPLICATIONS

This application claims the benefit under 35 U.S.C. §119 (e) of U.S. Provisional Patent Application 61/842,861, entitled: "On-The-Fly Combinatorial Platform for Measuring Defects in III-V Films Grown on Silicon" filed on 3 Jul. 2013, which is incorporated herein by reference in its entirety for all purposes.

BACKGROUND

Defect control and measurements have been identified recently as the most significant challenges facing the implementation of III-V materials in complementary metal-oxide-semiconductor (CMOS) devices. Defects form in III-V films grown epitaxially on silicon due to fundamental mismatches at a basic material level, in particular thermal, structural, and lattice constant mismatch. Various techniques have been proposed for inspection of III-V films and other such types of materials. Specific examples of inspection techniques include bright-field transmission electron microscopy (TEM), X-ray diffraction (XRD), electron channeling contrast imaging (ECCI), and cathodoluminescence (CL). However, these techniques are often too expensive and/or time consuming and cannot be utilize in production environment.

Specifically, bright-field TEM provides an accurate determination of the dislocation density when the dislocations can be clearly distinguished. In other words, it can be applied with high accuracy below a certain dislocation density. However, the TEM inspection is destructive and time consuming and requires very demanding sample preparation. XRD provides an average dislocation density of the bulk deformed material in a shorter time. The XRD analysis of defect structures requires the use of a well-justified underlying model that connects a certain dislocation density and distribution with a total displacement gradient field. ECCI is a scanning electron microscopy (SEM) technique that relies on the backscattered electron intensity being dependent on the orientation of the crystal lattice planes with respect to the incident electron beam due to the electron channeling mechanism. Slight local distortions in the crystal lattice due to dislocations cause a modulation of the backscattered electron intensity, allowing the defect to be imaged. However, like other techniques, the ECCI methods are slow and not ready for production inspection. Two-dimensional CL images may be used to deduce the dislocation densities of the films. CL measurements may be performed at room temperature by using a field emission scanning electron microscope with electron beam energy of 10 keV. The spatial localization of the emission energy is unambiguously determined by measurements of the spatially-resolved monochromatic CL. Since the dislocations should not emit any luminescence, the positions corresponding to dislocations in the epitaxial film are relatively dark in the CL image. However, for CL to be effective in a "nondestructive" mode, low beam power is required.

SUMMARY

Provided are methods of high productivity combinatorial (HPC) inspection of semiconductor substrates. A substrate includes two layers of dissimilar materials interfacing each other, such as a stack of a silicon bottom layer and an indium gallium arsenide top layer. The dissimilar materials have one or more of thermal, structural, or lattice mismatches. As a part of the inspection, the top layer is etched in a combinatorial manner. Specifically, the top layer is divided into multiple site-isolated regions. One such region may be etched using different process conditions from another region. Specifically, etching temperature, etching duration and/or etchant composition may vary among the site-isolated regions. After combinatorial etching, each region is inspected to determine its etch-pit density (EPD) value. These values may be then analyzed to determine an overall EPD value for the substrate, which may involve discarding EPD values for over-etched and under-etched regions.

In some embodiments, a method of HPC inspection of a semiconductor substrate involves receiving the semiconductor substrate including a first layer and a second layer. The first layer is disposed over and directly interfacing the second layer. The first layer includes a first material, while the second layer includes a second material such that the first material and the second material having at least one of a thermal mismatch, a structural mismatch, or a lattice mismatch. The first layer includes multiple site-isolated regions. The method may proceed with etching a portion of the first layer in each of the multiple site-isolated regions using a set of process conditions. The sets of process conditions for at least two of the multiple site-isolated regions vary in a combinatorial manner. The method then proceeds with inspecting each of the multiple site-isolated regions to determine an EPD value. In some embodiments, inspecting each of the multiple site-isolated regions includes optical microscope inspection.

In some embodiments, the sets of process conditions vary based on at least one of an etching duration, an etchant composition, or an etching temperature. For example, at least two of the multiple site-isolated regions use different etching durations during etching of the first layer. At least two other of the multiple site-isolated regions may use different etchant compositions during etching of the first layer or use different etching temperatures during etching of the first layer. In some embodiments, at least two of the multiple site-isolated regions use different etching durations, different etchant compositions, and different etching temperatures during etching of the first layer. In other words, all three etching conditions are varied between these two site-isolated regions.

In some embodiments, the method also involves performing a statistical analysis on all EPD values of the multiple site-isolated regions to determine an EPD value for the semiconductor substrate. The statistical analysis may involve removing one or more outlying EPD values corresponding to one or more of over-etched site-isolated regions and/or under-etched site-isolated regions. The statistical analysis may involve correlating EPD values for the multiple isolated regions to one or more variations in the sets of process conditions. For example, the EPD values for the multiple isolated regions may be correlated to one or more of an etching temperature variation, to an etchant composition variation, and/or to an etching duration variation.

In some embodiments, the second material includes silicon, while the first material includes one of germanium, germanium-tin, gallium-antimony, indium gallium arsenide. Alternatively, the second material includes germanium, while the first material includes one of germanium-tin or gallium-silicon. The second material may include silicon, while the first material includes indium gallium arsenide.

In some embodiments, the multiple site-isolated regions may include at least 18 non-overlapping site-isolated regions on the semiconductor substrate or, more specifically, at least about 24 regions. In some embodiments, a portion of the first layer outside of the multiple site-isolated regions remains unetched. As such, this portion of the first layer may remain free from any etching solution. During etching, each of the multiple site-isolated regions is sealed from a remaining portion of the substrate. In some embodiments, portions of the first layer in the multiple site-isolated regions are etched at a same time.

The sets of process conditions may vary in a combinatorial manner among the multiple site-isolated regions based on a composition of the first materials and a composition of the second materials. In some embodiments, all sets of process conditions used to etch portions of the first layer in the multiple sited isolated regions vary in the combinatorial manner. In some embodiments, portions of the first layer in two control site-isolated regions of the multiple site-isolated regions are etched using the same process conditions.

A method of HPC inspection of a semiconductor substrate may involve receiving the semiconductor substrate including a first layer and a second layer. The first layer is disposed over and directly interfacing the second layer. The first layer includes indium gallium arsenide, while the second material includes silicon. The first layer is divided into multiple site-isolated regions. The method proceed with etching a portion of the first layer in each of the multiple site-isolated regions using a set of process conditions, such that an etching temperature varies among the multiple site-isolated regions in a combinatorial manner between 25° C. and 100° C. Furthermore, an etching duration varies among the multiple site-isolated regions in a combinatorial manner between 5 seconds and 5 minutes or, more specifically, between about 30 seconds and 2 minutes. The method proceeds with inspecting each of the multiple site-isolated regions to determine an EPD value.

These and other embodiments are described further below with reference to the figures.

DETAILED DESCRIPTION OF EXAMPLE EMBODIMENTS

Figure 1:
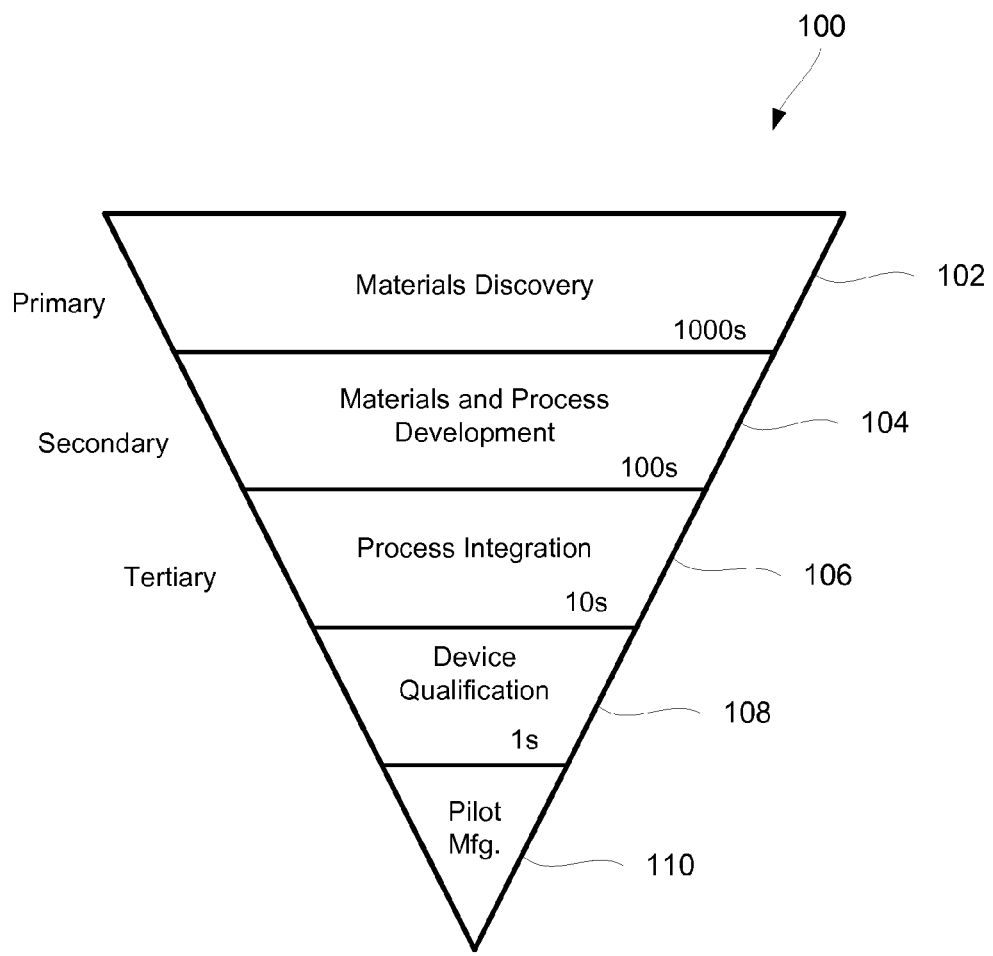
FIG. 1 illustrates a schematic diagram for implementing combinatorial processing and evaluation using primary, secondary, and tertiary screening, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Defect control and measurements have been identified recently as the most significant challenges facing the implementation of III-V CMOS devices, such as devices for low power/high performance mobile device applications and other similar applications. Integration of two dissimilar materials is not trivial. Fundamental mismatches at a basic material level, in particular thermal, structural, and lattice constant mismatch, introduce specific structural defects when both material systems are directly integrated. The introduction of dislocations in the active layers is not beneficial from device performance stand point since these dislocations form shunt paths and may act as recombination centers or traps for carriers. The balance between lattice relaxation and material quality needs to be achieved in order to optimize any heteroepitaxial III-V device on silicon (Si).

Each type of mismatch between two dissimilar materials commonly used to form a stack will now be described. Thermal mismatch arises from the difference in thermal expansion coefficient of two dissimilar materials, such as a III-V material and silicon. The thermal mismatch leads to the possible formation of dislocations.

Structural mismatch occurs from the different crystalline structures of the group III/V and group IV materials. Group IV materials, such as silicon and germanium, crystallize in the form of cubic diamond structure. This structure includes two interpenetrating face-centered cubic (FCC) lattices that differ from each other in the spatial orientation, in which each atom is connected to the three nearest neighbors (belonging to the "opposite" lattice) to form a tetrahedron. Most of the III-V materials crystallize in the cubic zincblende structure, which is analogous to the diamond structure with each sub-lattice containing only atoms of the same species, i.e., either group III or group V atoms. When III-V materials are grown on group IV materials, the interface between the two materials forms Antiphase Domains (APD) due to the lower symmetry of the zincblende lattice when compared to the diamond lattice. An APD is a 2-dimensional, electrically active defect delimited by the so-called Antiphase Boundary (APB) bonds, which, for example, consist in planes formed by Ga—Ga or As—As bonds in the case of GaAs. APDs are expected to form in atomically stepped surfaces where the location of group III and group V may interchange resulting in an alteration in the order of the atoms on the surface. APBs are electrically active.

Lattice mismatch refers to the situation where two materials featuring different lattice constants are brought together by deposition of one material on top of another. In general, the lattice mismatch can prevent growth of defect-free epitaxial film unless thickness of the film is below certain critical thickness. In this last case lattice mismatch is compensated by the strain in the film. When the III-V material is epitaxially grown on silicon, for example, the difference in the lattice constants of the two materials may be accommodated by straining the top epitaxial layer. For the case of a GaAs top layer grown on a silicon substrate, the lattice constant of the top layer may be larger than the one of the substrate, which causes the resulting strain to be compressive. Lattice mismatch may be quantified by the misfit, which for the case of the GaAs/Si stack ascends to 4% change from Si to GaAs. As the top layer is grown, the strain (either compressive or tensile) keeps increasing, "distorting" the epilayer until it reaches a certain thickness. When the critical thickness of the top layer is reached, all the strain is relieved by means of the formation of misfit dislocations (at the interface) and the associated threading dislocations (perpendicular to the interface). The critical thickness is a function of epilayer and substrate lattice constants and decreases as the misfit increases. In some cases, for large misfit values, the critical thickness may be as thin as a few monolayers causing an immediate relaxation of the epitaxial layer by the formation of a large number of dislocations. For example, the 4% misfit between GaAs and Si may allow a critical thickness of ~100 nm when GaAs is grown on Si generating a threading dislocations density value as high as 109 $cm^{-2}$.

The defects in a top layer of a stack of two dissimilar materials may be inspected using an etch pit-density (EPD) technique. The EPD involves etching the surface of the top layer followed by inspecting the etched surface using optical contrast. It has been found that the etch rate is increased at dislocations of the crystal resulting in pits relative to other portions of the surface. For example, the pits formed on an etched III-V surface, due to the anisotropic etching around dislocations, may be efficiently scatter light and thus may reduce transmission. In fact, there is a quantitative relationship between the fractional transmission and the EPD, which is a ratio of transmission on a surface with and without etch pits. A reference surface without etch pits is measured first. Then a second measurement is done with etch pits delineated using a chemical etchant. The ratio between the two transmission factors is used to estimate the EPD. However, there are many challenges with implementing the EPD technique for inspecting a stack of two dissimilar materials. Specifically, etch conditions need to be specifically selected to provide satisfactory defect decoration. These etch conditions differ depending on materials of the stack and thicknesses of each layer in the stack. Furthermore, during the etching process, a careful balance is needed to ensure that every defect is etched to a point where it can be distinguished, but not over-etched to the point where they begin to merge together. When the latter occurs, the density of defects is underestimated. The concentration and duration of etching should be selected high enough that all points of dislocation termination are attacked but low enough that defect free film is not attacked. Furthermore, the optimal etching conditions may be different for films grown by different techniques (e.g., molecular beam epitaxy (MBE) versus metalorganic vapour phase epitaxy (MOVPE)). Finally, small etch rates are typically needed. Etch depths needed for delineation of defects depend on the top material and its doping type. For example, if only 60 nm III-V film can practically be deposited on silicon, and only 10 seconds is allowed for the defect-delineation etching process (for fast throughput), the etching rate required must be less than 0.1 µm/min. Conventionally, a molten KOH was used for etching at 450° C. for about 40 minutes. This standard approach to etching does not allow addressing all possible variations of materials in a stack of dissimilar materials presented above.

When combined with high productivity combinatorial (HPC) methodology applied to an etching portion of the EPD analysis, the EPD method may provide a fast throughput metrology for mapping defects in dissimilar materials on large size substrates. In contrast to above-mentioned techniques, such as TEM, XRD, ECCI, and CL, having issues when used for inspection of III-V films, determining EPD values of the etched semiconductor substrates by inspection etched regions of the substrate may be useful for production environments and lab testing. Substrate-level, on-the-fly combinatorial delineation of defects provided by the HPC methodology may directly address the above challenges both in the epitaxial hardware design phase and the in-line manufacturing phase (e.g., send-ahead substrates).

Provided are methods for HPC inspection of semiconductor substrates. The methods may include inspection of a substrate including two layers of dissimilar materials, such as a silicon bottom layer and an indium gallium arsenide (In-GaSb) top layer. The dissimilar materials may have one or more of thermal, structural, or lattice mismatches as described above. As a part of the inspection, the top layer of such a stack may be etched in a combinatorial manner. Specifically, portions of the top layer may be associated with different site-isolated regions. A portion of the top layer in one region may be etched using different process conditions in comparison to another portion of the top layer in another region. Specifically, etching temperature, etching duration and/or etchant composition may vary among the site-isolated regions of the substrate. After combinatorial etching, each region may be inspected to determine the EPD value. These values may be analyzed to determine an overall EPD value for the substrate. Because different etching conditions used for different site-isolated regions on the same substrate, different EPD counts are expected. The variation in etching conditions may help to eliminate counts corresponding to under-etched and over-etched site-isolated regions as further described below.

High Productivity Combinatorial (HPC) Examples

HPC generally refers to techniques of differentially processing multiple regions of a substrate. It may involve varying materials, unit processes, process sequences, and other process parameters across multiple regions (referred to as site-isolated regions) provided on the substrate. The varied materials, unit processes, or process sequences can be evaluated (e.g., characterized) to determine whether further evaluation is warranted or whether a particular solution is suitable for production or high volume manufacturing.

FIG. 1 illustrates a schematic diagram for implementing combinatorial processing and evaluation using primary, secondary, and tertiary screening, in accordance with some embodiments. Specifically, diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as electronic testers and imaging tools (i.e., microscopes).

Materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106, where tens of materials and/or processes and combinations are evaluated. Tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

Diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways. Additional aspects of High Productivity Combinatorial (HPC) techniques are described in U.S. patent application Ser. No. 11/674,137, filed on Feb. 12, 2007, which is hereby incorporated by reference in its entirety for purposed of describing HPC techniques.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
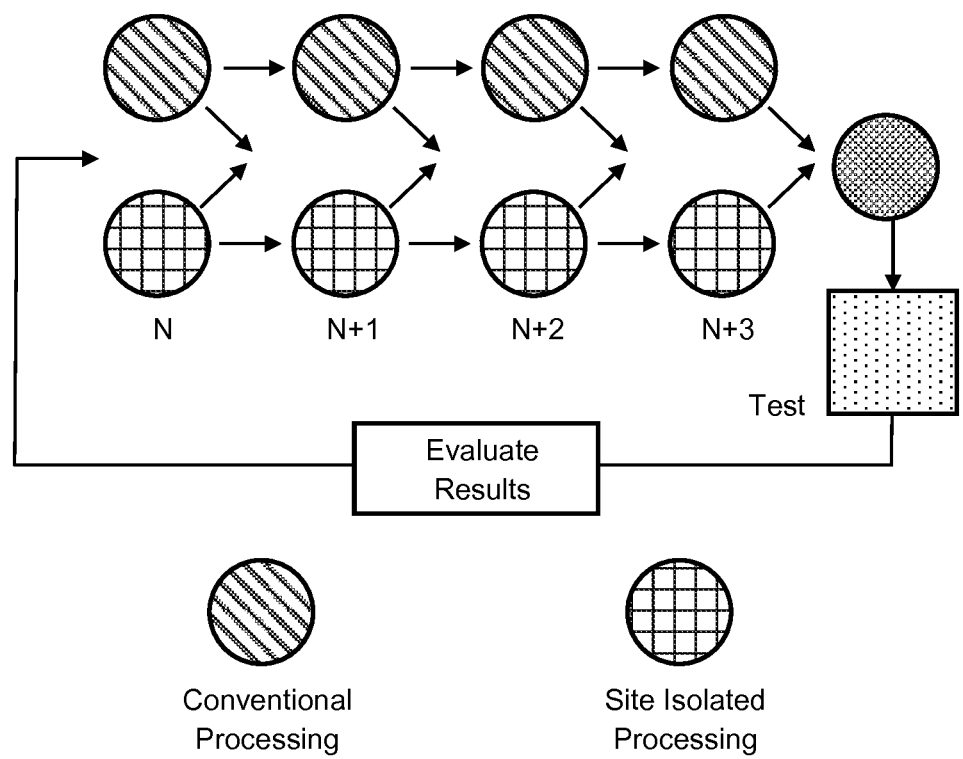
FIG. 2 is a simplified schematic diagram illustrating a methodology for combinatorial process sequence integration that includes site isolated processing and/or conventional processing, in accordance with some embodiments.

FIG. 2 is a simplified schematic diagram illustrating a general methodology for combinatorial process sequence integration that includes site isolated processing and/or conventional processing, in accordance to some embodiments. The substrate may be initially processed using conventional process N. In some embodiments, the substrate is then processed using site isolated process N+1. During site isolated processing, an HPC module may be used, some examples of which are described below. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
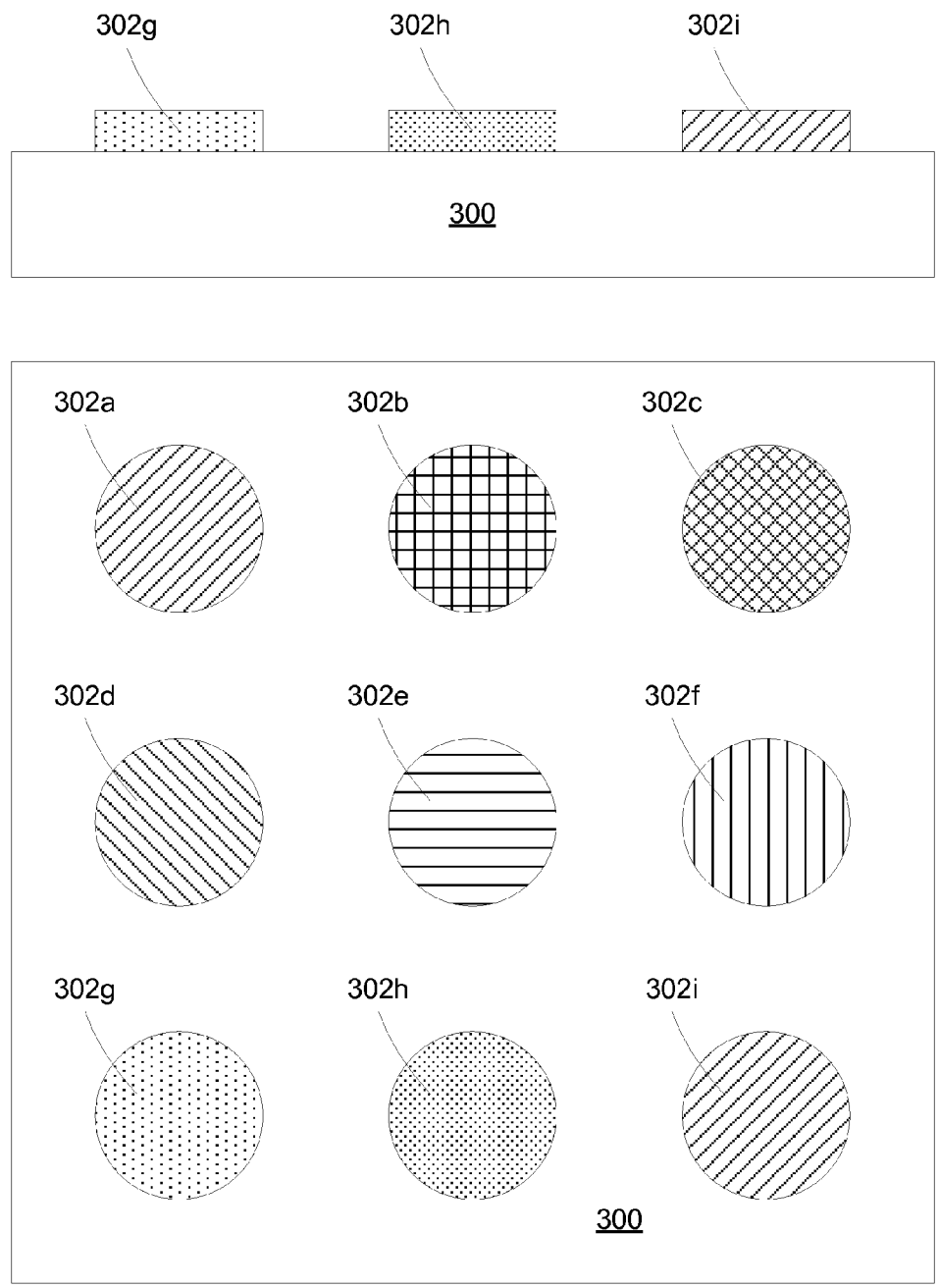
FIG. 3 illustrates a schematic diagram of a substrate that has been processed in a combinatorial manner, in accordance with some embodiments.

FIG. 3 illustrates a schematic diagram of a substrate 300 processed in a combinatorial manner, in accordance with some embodiments. Substrate 300 is shown to have nine site-isolated regions 302a-302i. Although substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view through the three site-isolated regions 302g-302i. The shading of the nine site-isolated regions illustrates that the process parameters used to process these regions have been varied in a combinatorial manner. The substrate may then be processed through a next step that may be conventional or may also be a combinatorial step as discussed earlier with respect to FIG. 2. One having ordinary skills in the art would understand that the substrate may include any number of the site-isolated regions, e.g., between about 20 and 40 or, more specifically, 28. All site-isolated regions may be processed using different processing conditions. In some embodiments, two or more site-isolated regions may be processed using the same processing conditions. For purposes of this disclosure, processing conditions are defined as any parameter that may impact on the outcome of the process. For example, in the etching context, processing parameters may include parameters of the etched materials (e.g., geometry, composition), composition of etching solution, processing temperature, duration, pre- and post-etching operations, and the like.

Figure 4:
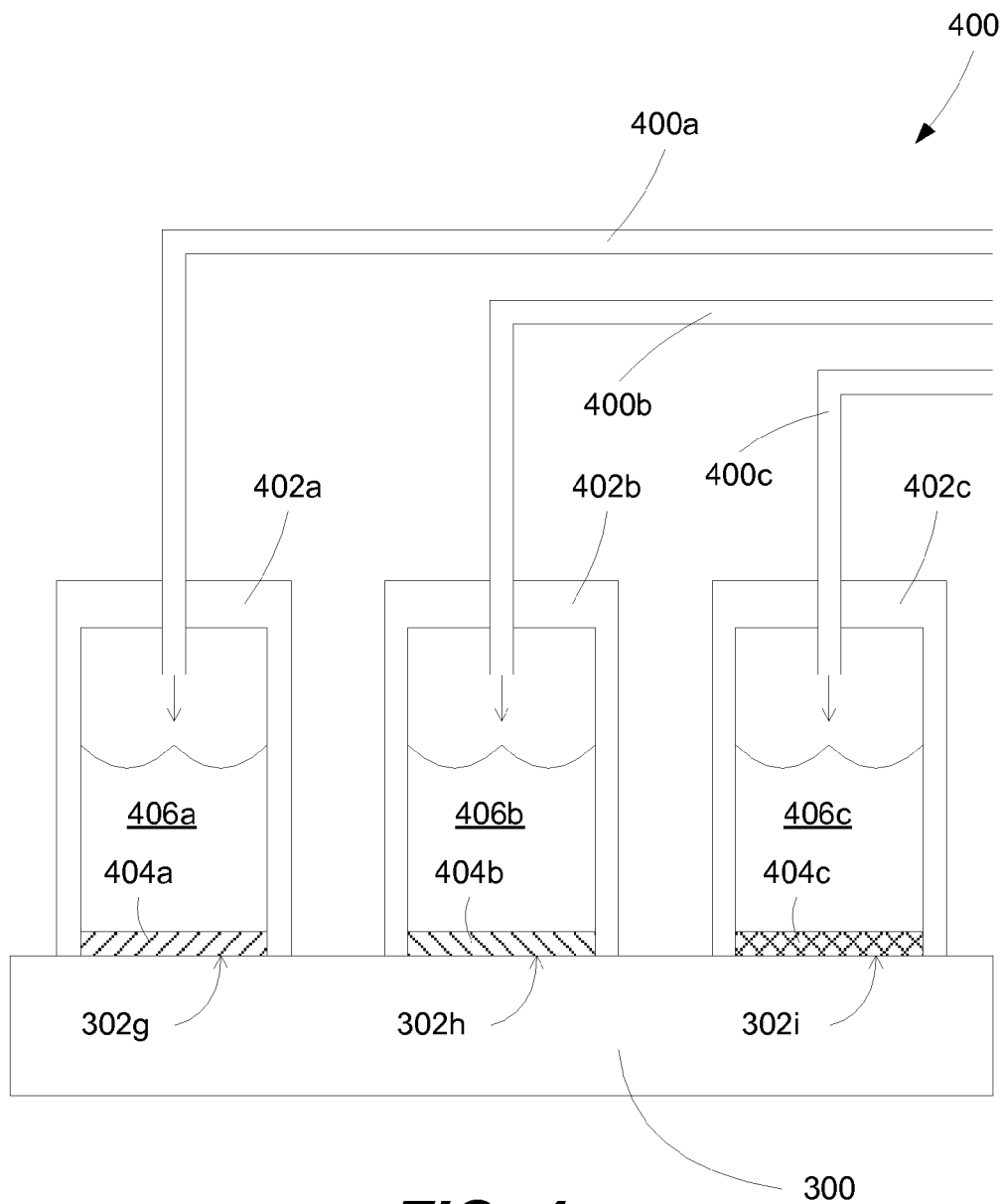
FIG. 4 illustrates a schematic diagram of a combinatorial wet processing system, in accordance with some embodiments.

FIG. 4 illustrates a schematic diagram of a combinatorial wet processing system 400, in accordance with some embodiments. System 400 may be used to investigate materials deposited or, more generally, processed using solution-based techniques. Those skilled in the art would understand that this is only one possible configuration of a combinatorial wet system. FIG. 4 illustrates a cross-sectional view of substrate 300 taken through the three site-isolated regions 302g-302i similar to the upper portion of FIG. 3 described above. Solution dispensing nozzles 400a-400c supply solutions 406a-406c having the same or different compositions (i.e., different solution chemistries 406a-406c) to chemical processing cells 402a-402c. In some embodiments, chemical processing cells 402a-402c may be maintained at different temperatures. Furthermore, etching may be performed for different time durations. FIG. 4 illustrates the deposition of layers 404a-404c within respective site-isolated regions 302g-302i. Although FIG. 4 illustrates a deposition step, other solution-based processes such as cleaning, etching, surface treatment, surface functionalization, and the like may be investigated in a combinatorial manner. The solution-based treatment can be customized for each of the site-isolated regions.

Processing Examples

Figure 5:
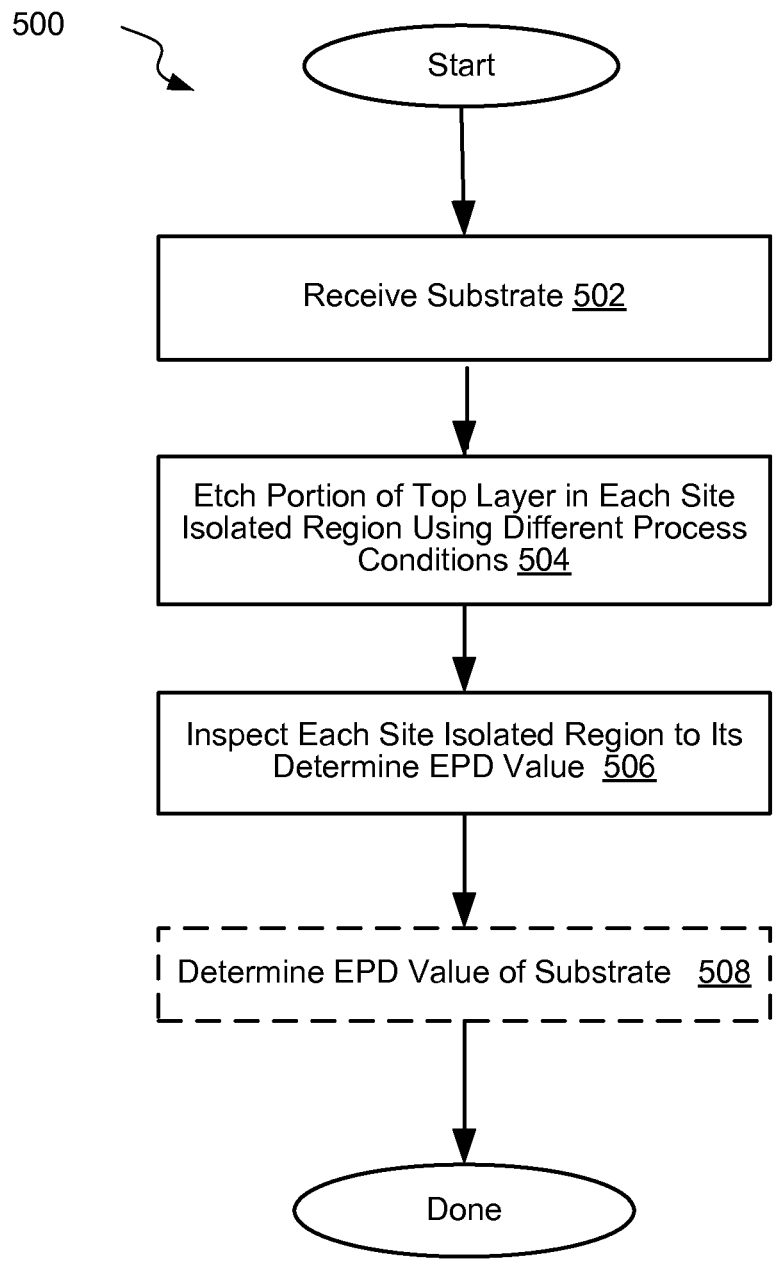
FIG. 5 illustrates a process flowchart corresponding to a method of high productivity combinatorial (HPC) inspection of a semiconductor substrate, in accordance with some embodiments.

FIG. 5 illustrates a process flowchart corresponding to a method 500 of HPC inspection of a semiconductor substrate, in accordance with some embodiments.

Method 500 may commence with receiving a substrate 300 during operation 502. In some embodiments, the substrate 300 includes a first layer, as a top layer, and a second layer, as a bottom layer. The top layer may be disposed over the bottom layer and may directly interface the bottom layer. The top layer may include a first material and the bottom layer may include a second material. The first material and the second material may have at least one of a thermal mismatch, a structural mismatch, or a lattice mismatch. Various examples of different mismatches were described above. In some embodiments, the first material includes one or more of the following materials: germanium (Ge), germanium-tin (GeSn), gallium-antimony (GaSb), indium gallium arsenide (InGaSb). In some embodiments, the second material includes silicon (Si).

In some embodiments, the first material includes one of GeSn or gallium-silicon (GaSi), while the second material includes germanium (Ge). In some embodiments, the first material includes InGaSb, and the second material includes silicon (Si). In some embodiments, the first material includes gallium-arsenide (GaAs) and the second material includes silicon (Si). In some embodiments, the first material includes indium gallium arsenide (InGaAs), and the second material includes gallium-arsenide (GaAs).

Although specific examples of the first material, i.e. the top layer material and the second layer, i.e. the bottom layer material are illustrated, those skilled in the art will understand that the top layer material and the bottom layer material may include any two dissimilar materials forming a stack and interfacing each other. The mismatches that may occur between the two dissimilar materials listed in the table below.

TABLE

| Top Layer Material | Bottom Layer Material |
| --- | --- |
| Germanium (Ge) | Silicon (Si) |
| Germanium Tin (GeSn) | Silicon (Si) |
| Gallium Antimony (GaSb) | Silicon (Si) |
| Gallium Arsenide (GaAs) | Silicon (Si) |
| Germanium Tin (GeSn) | Germanium (Ge) |
| Gallium Silicon (GaSi) | Germanium (Ge) |
| Indium Gallium Arsenide | Gallium-Arsenide |

TABLE-continued

| Top Layer Material | Bottom Layer Material |
|---|---|
| (InGaAs) | (GaAs) |
| Gallium Nitride (GaN) | Silicon (Si) |

Referring to FIG. 3, the top layer of substrate 300 may be divided into site-isolated regions 302a-302i. In some embodiments, substrate 300 may include at least 18 non-overlapping site-isolated regions 302a-302i. In general, any number of site-isolated regions may be present on the same substrate. The greater number of site isolated regions allows testing more different etching conditions and/or duplicating the same etching conditions in different regions. However, increasing the number of site-isolated regions on the same substrate reduces the size of each region.

Returning to FIG. 5, method 500 may proceed with etching a portion of the top layer in each of the multiple site-isolated regions during operation 504. During the etching, each of the multiple site-isolated regions may be sealed from a remaining portion of the substrate. Two or more portions of the top layer in different site-isolated regions may be etched at the same time and using different etching conditions. For example, one site isolate region may be sealed using one cell containing one etching solution while another site-isolated region may be sealed using another cell containing another etching solution. The etching solutions may have different compositions, and the top layer may be exposed to these etching solutions at the same time. This parallel testing allows higher test throughput and is provided by specific configurations of the processing equipment as described above with reference to FIG. 3.

The etching is performed using a set of process conditions, such as an etching temperature, an etchant composition, and an etching duration. The process conditions may vary in a combinatorial manner for at least two site-isolated regions. In other words, at least two different portions of the top layer corresponding to these site-isolated regions are etched using two different sets of process conditions. In particular, the sets of process conditions may vary based on an etching duration, an etchant composition, an etching temperature, and so forth. In some embodiments, each one of the site-isolated regions may have different process conditions. In this example, all site-isolated regions use different etching conditions. In some embodiments, at least two of the multiple site-isolated regions may use different etching durations during etching of the top layer. At least two other multiple site-isolated regions may use different etchant compositions or different etching temperatures during etching of the top layer. Furthermore, at least two site-isolated regions may use different etching durations, different etchant compositions, or different etching temperatures during etching of the top layer. Furthermore, the sets of process conditions may be selected based on a composition of the first materials, i.e. the top layer material, and a composition of the second materials, i.e. the bottom layer material. Furthermore, the thickness of the top layer and, in some embodiments, the thickness of the bottom layer may be used to determine etching conditions and their variability.

In some embodiments, all sets of process conditions used to etch portions of the top layer in the multiple sited isolated regions may vary in the combinatorial manner. Alternatively, portions of the top layer in two control site-isolated regions may be etched using the same process conditions.

The particular examples of etching conditions, such as etching duration, etchant type, etching temperature, and so forth, for different top layer materials are presented below. For example, a InGaAs layer may be etched using a 1:1-1:100 mixture of hydrogen peroxide and hydrochloric acid ($H_2O_2$: HCl) at temperatures of between about 25° C. and 100° C. and for duration of between about 5 seconds and 5 minutes or, more specifically, between about 30 seconds and 2 minutes.

For example, a GaAs layer may be etched at temperatures of up to 100° C. using a mixture of water, silver nitrate, chromium oxide, and hydrofluoric acid. One example of such an etching solution includes $H_2O$:$AgNO_3$:$CrO_3$:HF. The relative amounts of water, silver nitrate, chromium oxide, and hydrofluoric acid may be varied in a combinatorial manner.

A InGaAs layer may be etched with a solution including nitric acid, hydrofluoric acid, water, and silver nitride. Etching temperatures may be between about 25° C. and 75° C. such as about 50° C. The temperature may be varied in a combinatorial manner. One example of such etching solution is 3:2:5:1 by volume of $HNO_3$:HF:$H_2O$:$AgNO_3$. The relative amounts of nitric acid, hydrofluoric acid, water, and silver nitride may be varied in a combinatorial manner.

An indium phosphide (InP) layer may be etched with a mixture of a phosphoric acid, hydrogen bromide (e.g., $H_3PO_4$:HBr at a ratio of 2:1) or a mixture of a phosphoric acid, hydrogen peroxide, and water (e.g., $H_3PO_4$:$H_2O_2$:$H_2O$ at a ratio of 1:1:3). The etching may be performed at a room temperature to achieve relatively low etch rates, such as about 0.2 μm/min.

An InP layer may be etched with a mixture of hydrogen bromide and hydrofluoric acid (e.g., HBr:HF at a ratio of 1:5). Room temperature may be used for this etching. Both temperatures and the composition of the etching solution may be varied combinatorially.

An InGaAs layer grown on GaAs substrate may be etched with a mixed solution of sulfuric acid, water, and hydrogen peroxide (e.g., $H_2SO_4$:$H_2O$:$H_2O_2$ at a volumetric ratio of 3:1:1) at temperatures of between about 40° C. and 80° C., such as about 60° C., or a mixed solution of nitric acid, hydrogen fluoride, water, and silver nitrate, (e.g., $HNO_3$:HF: $H_2O$:$AgNO_3$ at a volumetric ratio of 3:2:5:1) at temperatures of 30° C. to 70° C., such as about 50° C.

An InGaAs layer may be etched in a two-step process. First, the InGaAs layer may be chemically oxidized using hydrogen peroxide ($H_2O_2$, e.g., 5-20 mM). The product of this oxidation may be then dissolved in hydrochloric acid (HCl e.g., 0.001-1 M).

An InGaAs layer may be etched using a mixture of phosphoric acid, hydrogen bromide (e.g., $H_3PO_4$:HBr at a ratio of 2:1) at room temperature.

An InGaAs layer may be etched using a mixture of hydrochloric acid, nitric acid, and water (e.g., HCl:$HNO_3$:$H_2O$ at a ratio of 6:1:6) at room temperature. Any of the process conditions specified above can be varied combinatorially.

Method 500 may proceed with inspecting each of the multiple site-isolated regions to determine the EPD values of the site-isolated regions during operation 506. The EPD values can be determined according to "Testing Of Materials For Semiconductor Technology —Determination Of Dislocations In Monocrystals Of 3-5-compound Semi-conductors—Part 1: Gallium Arsenide" DIN 50454-1 (2000-07) and "Test Method for Crystallographic Perfection of Gallium Arsenide by Molten Potassium Hydroxide (KOH) Etch Technique" ASTM F 1404 (2007). The technique for providing EPD values for etched semiconductor substrates may be based on reflectivity measurements. The technique may use a direct measurement of the average area of the etch pits as an input parameter. In particular, a beam of light may be generated (e.g., the beam from a broad band halogen bulb) and focused normally onto the etched surface as well as onto a reference polished surface. The focusing may be done by a microscope lens, in particular, each of the multiple site-isolated regions may be inspected by an optical microscope. The light reflected normally from the substrates may be directed to a photodetector, whose output may be fed into a preamplifier followed by a lock-in amplifier. A reference signal may be provided to the lock-in amplifier. The intensity of the light reflected from the reference substrate, referred herein as a reference intensity $R_e$, and the intensity of the light reflected from the etched substrate, referred herein as an intensity $R_e$, may be digitized by digitizing (e.g., 12 bit analog-to-digital conversion) the direct current (DC) output of the lock-in amplifier by a digital processor. The EPD value may be computed by utilizing the relation $$EPD=-(1/A_p)\log(R_e/R_o),$$

wherein $A_p$ is the average etch pit area. The substrate may be suitably moved stepwise in a plane perpendicular to the light beam by motors under computer control so that a map of the EPD values at a preselected number of points on the test substrate is automatically generated.

Method 500 may proceed with determining EPD value of the substrate during optional operation 508. The EPD value for the semiconductor substrate may be determined by performing a statistical analysis on all EPD values of the multiple site-isolated regions. For example, the process conditions, such as etching temperature, etching duration, etchant concentration, or etchant type, may be changed among different site-isolated regions. Various statistical analyses may performed to, for example, correlate EPD values obtained during operation 506 for each of the multiple isolated regions to one or more process condition variations. Specifically, the statistical analysis may include correlating the EPD values for the multiple isolated regions to etching temperature variations, correlating the EPD values to etchant composition variations, and/or correlating the EPD values to etching duration variations. The correlation results may be used for determining variations in the process conditions in future process iterations.

Figure 6:
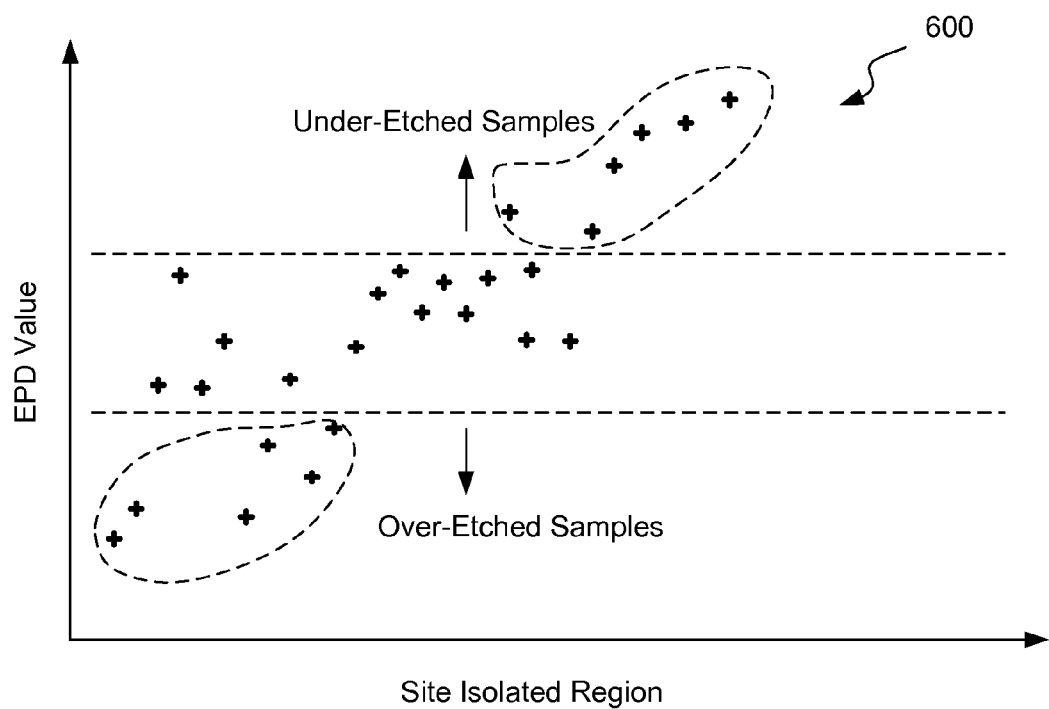
FIG. 6 illustrates an illustrative plot of EPD values for different site-isolated regions.

FIG. 6 illustrates an illustrative plot of EPD values for different site-isolated regions. The site-isolated regions are inspected to determine their EPD values that may provide some indications whether some site-isolated regions are over-etched or under-etched. The EPD values corresponding to such over-etched or under-etched samples of the site-isolated regions may be non-representative (i.e., not accounted for) for the statistical analysis. Therefore, when performing the statistical analysis, the outlying EPD values corresponding to the over-etched and/or under-etched site-isolated regions may be removed from consideration.

In some embodiments, an average parameter of the EPD value may be calculated for the semiconductor substrate to evaluate the quality of the semiconductor substrate. Furthermore, standard deviation of the EPD value may be calculated to show how much variation from the average EPD value exists.

The calculated EPD values of the substrate may be used in a further analysis to determine future processing conditions for substrates of the same or similar materials. In particular, reference tables may be compiled for specific materials to facilitate selection of the processing conditions for the semiconductor substrate.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method of high productivity combinatorial (HPC) inspection of a semiconductor substrate, the method comprising:
   receiving the semiconductor substrate comprising a first layer and a second layer,
      the first layer disposed over and directly interfacing the second layer,
      the first layer comprising a first material,
      the second layer comprising a second material,
      the first material and the second material having at least one of a thermal mismatch, a structural mismatch, or a lattice mismatch,
      the first layer comprising multiple site-isolated regions (SIRs) defined thereon;
   performing an etch process on a portion of the first layer in each SIR,
      the etch process comprising exposing each of the SIRs to one of a plurality of etch process conditions,
      the etch process conditions being varied in a combinatorial manner between at least two of the SIRs; and
   inspecting each of the site-isolated regions to determine an etch-pit density (EPD) value.

2. The method of claim 1, wherein the plurality of etch process conditions vary based on at least one of an etching duration, an etchant composition, or an etching temperature.

3. The method of claim 1, wherein the at least two of the SIRs use different etching durations during etching of the first layer, and wherein the at least two other of the SIRs use different etchant compositions during etching of the first layer or wherein the at least two other of the SIRs use different etching temperatures during etching of the first layer.

4. The method of claim 1, wherein the at least two of the SIRs use different etching durations, different etchant compositions, and different etching temperatures during etching of the first layer.

5. The method of claim 1, further comprising performing a statistical analysis on all EPD values of the multiple site-isolated regions to determine an EPD value for the semiconductor substrate.

6. The method of claim 5, wherein performing the statistical analysis comprises removing one or more outlying EPD values corresponding to one or more of over-etched site-isolated regions and/or under-etched SIRs.

7. The method of claim 5, wherein performing the statistical analysis comprises correlating EPD values for the SIRs to one or more variations in the sets of etch process conditions.

8. The method of claim 5, wherein performing the statistical analysis comprises correlating EPD values for the SIRs to an etching temperature variation in the sets of etch process conditions, correlating EPD values for the SIRs to an etchant composition variation in the sets of etch process conditions, or correlating EPD values for the SIRs to an etching duration variation in the sets of etch process conditions.

9. The method of claim 1, wherein the second material comprises silicon, and wherein the first material comprises one of germanium, germanium-tin, gallium-antimony, or indium gallium arsenide.

10. The method of claim 1, wherein the second material comprises germanium, and wherein the first material comprises one of germanium-tin or gallium-silicon.

11. The method of claim 1, wherein the second material comprises silicon, wherein the first material comprises indium gallium arsenide.

12. The method of claim 1, wherein the SIRs comprise at least 18 non-overlapping SIRs on the semiconductor substrate.

13. The method of claim 1, wherein a portion of the first layer outside of the SIRs remains unetched.

14. The method of claim 1, wherein inspecting each of the SIRs comprises optical microscope inspection.

15. The method of claim 1, wherein, during etching, each of the SIRs is sealed from a remaining portion of the substrate.

16. The method of claim 1, wherein portions of the first layer in each of the SIRs are etched at a same time.

17. The method of claim 1, wherein all sets of etch process conditions used to etch portions of the first layer in the multiple sited isolated regions vary in the combinatorial manner.

18. The method of claim 1, wherein portions of the first layer in two SIRs are etched using a same etch process condition.

19. A method of high productivity combinatorial (HPC) inspection of a semiconductor substrate, the method comprising:

receiving the semiconductor substrate comprising a first layer and a second layer,
   the first layer disposed over and directly interfacing the second layer,
   the first layer comprising indium gallium arsenide,
   the second material comprises silicon,
   the first layer comprising multiple site-isolated regions (SIRs) defined thereon;

performing an etch process on a portion of the first layer in each SIR,
   the etch process comprising exposing each of the SIRs to one of a plurality of etch process conditions,
   wherein an etching temperature varies among the multiple site-isolated regions in a combinatorial manner between 25° C. and 100° C., and
   wherein an etching duration varies among the multiple site-isolated regions in a combinatorial manner between 5 seconds and 5 minute; and inspecting each of the multiple site-isolated regions to determine an etch-pit density (EPD) value.

* * * * *